(12) United States Patent
Tsai et al.

(10) Patent No.: US 11,903,179 B2
(45) Date of Patent: Feb. 13, 2024

(54) METHOD OF MANUFACTURING SEMICONDUCTOR STRUCTURE HAVING CONTACT STRUCTURE

(71) Applicant: NANYA TECHNOLOGY CORPORATION, New Taipei (TW)

(72) Inventors: Chih-Ying Tsai, New Taipei (TW); Jui-Seng Wang, New Taipei (TW); Yi-Yi Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 81 days.

(21) Appl. No.: 17/724,161

(22) Filed: Apr. 19, 2022

(65) Prior Publication Data
US 2023/0337411 A1    Oct. 19, 2023

(51) Int. Cl.
*H10B 12/00* (2023.01)

(52) U.S. Cl.
CPC ................................ *H10B 12/0335* (2023.02)

(58) Field of Classification Search
CPC .... H10B 12/0335; H10B 12/02; H10B 12/30; H10B 12/053; H10B 12/31; H10B 12/485
See application file for complete search history.

(56) References Cited

U.S. PATENT DOCUMENTS

| | | | |
|---|---|---|---|
| 9,536,980 B1* | 1/2017 | Huang | H01L 29/6653 |
| 2009/0256185 A1* | 10/2009 | Cheng | H01L 21/84 |
| | | | 257/E29.345 |
| 2018/0175038 A1* | 6/2018 | Lee | H01L 21/76224 |
| 2018/0342521 A1* | 11/2018 | Son | H01L 21/76816 |
| 2018/0350905 A1* | 12/2018 | Yoon | H01L 21/76232 |
| 2019/0221669 A1* | 7/2019 | Lee | H10B 12/30 |
| 2020/0279779 A1* | 9/2020 | Li | H01L 29/7827 |

FOREIGN PATENT DOCUMENTS

| | | |
|---|---|---|
| TW | 200952176 A | 12/2009 |
| TW | 202139462 A | 10/2021 |
| TW | 202207368 A | 2/2022 |

* cited by examiner

*Primary Examiner* — Shahed Ahmed
*Assistant Examiner* — Khatib A Rahman
(74) *Attorney, Agent, or Firm* — MUNCY, GEISSLER, OLDS & LOWE, P.C.

(57) ABSTRACT

The present disclosure provides a method of manufacturing a semiconductor structure. The method includes providing a semiconductor substrate including an active region and an isolation structure. The method also includes forming a contact structure on the active region of the semiconductor substrate. The method further includes forming a dielectric spacer on opposite sides of the contact structure. The method also includes forming a conductive element on the isolation structure of the semiconductor substrate, wherein the dielectric spacer has a concave surface facing the conductive element.

15 Claims, 14 Drawing Sheets

METHOD OF MANUFACTURING SEMICONDUCTOR STRUCTURE HAVING CONTACT STRUCTURE

TECHNICAL FIELD

The present disclosure relates to a method of manufacturing a semiconductor structure, and more particularly, to a method of manufacturing a semiconductor structure having a contact structure.

DISCUSSION OF THE BACKGROUND

With the rapid growth of electronic industry, the development of semiconductor devices has achieved high performance and miniaturization. As the size of semiconductor devices shrinks, undesired short-circuit between conductive features has become a crucial issue.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a semiconductor substrate, a contact structure, a first conductive element, and a first dielectric spacer structure. The semiconductor substrate includes an active region and an isolation structure. The contact structure is on the active region of the semiconductor substrate. The first conductive element is on the isolation structure of the semiconductor substrate. The first dielectric spacer structure is between the contact structure and the first conductive element. The first dielectric spacer structure has a first concave surface facing the first conductive element.

Another aspect of the present disclosure provides a semiconductor structure. The semiconductor structure includes a semiconductor substrate, a contact structure, and a dielectric spacer. The contact structure is on the semiconductor substrate. The contact structure has a first side and a second side opposite to the first side. The dielectric spacer is adjacent to the contact structure and has a first concave surface.

Another aspect of the present disclosure provides a method of manufacturing a semiconductor structure. The method includes providing a semiconductor substrate including an active region and an isolation structure. The method also includes forming a contact structure on the active region of the semiconductor substrate. The method further includes forming a dielectric spacer on opposite sides of the contact structure. The method also includes forming a conductive element on the isolation structure of the semiconductor substrate, wherein the dielectric spacer has a concave surface facing the conductive element.

In the semiconductor structure, with the design of the network structure of the dielectric spacer, the contact structure (e.g., the bit line contact) and the conductive element (e.g., the contact to a capacitor) can be spaced apart from each other by a relatively large distance generated by the dielectric spacer, and thus undesired short-circuit between the contact structure (e.g., the bit line contact) and the conductive element (e.g., the contact to a capacitor) can be prevented effectively.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
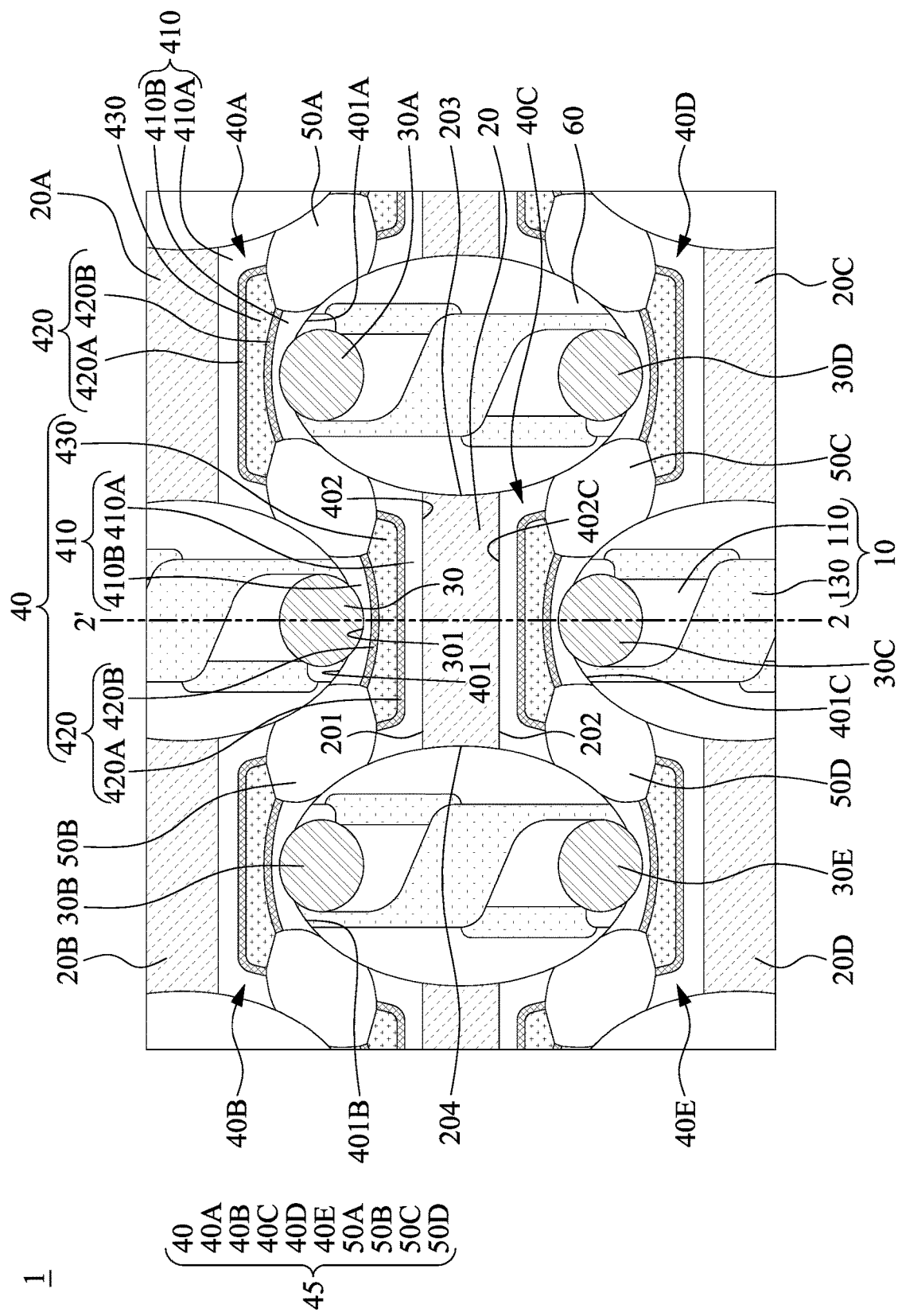
FIG. 1 is a top view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a top view of a semiconductor structure 1, in accordance with some embodiments of the present disclosure. The semiconductor device 1 includes a semiconductor substrate 10, one or more contact structures (e.g., contact structures 20, 20A, 20B, 20C, and 20D), one or more conductive elements (e.g., conductive elements 30, 30A, 30B, 30C, 30D, and 30E), a dielectric spacer 45, and a buffer layer 60. It should be noted that some elements may be omitted for clarity.

The semiconductor substrate 10 may include one or more active regions 110 and one or more isolation structures 130 adjacent to the active regions 110. In some embodiments, the active regions 110 of the semiconductor substrate 10 may be defined by the isolation structures 130. The semiconductor substrate 10 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. The isolation structure 130 may be formed of or include an insulating material such as silicon oxide, silicon nitride, silicon oxynitride, or a combination thereof.

The contact structure 20 may be disposed or formed on the semiconductor substrate 10. In some embodiments, the contact structure 20 is disposed or formed on the active region 110 of the semiconductor substrate 10. In some embodiments, the contact structure 20 has a side 201 (also referred to as "a side surface" or "a lateral surface") and a side 202 (also referred to as "a side surface" or "a lateral surface") opposite to the side 201. In some embodiments, the contact structure 20 further has a lateral surface 203 (also referred to as "a side surface") extending between the side 201 and the side 202. In some embodiments, the lateral surface 203 may be or include a concave curved surface. In some embodiments, the contact structure 20 further has a lateral surface 204 (also referred to as "a side surface") extending between the side 201 and the side 202. In some embodiments, the lateral surface 204 is opposite to the lateral surface 203. In some embodiments, the lateral surface 204 may be or include a concave curved surface.

In some embodiments, the lateral surface 203 and the lateral surface 204 of the contact structure 20 are concave toward opposite directions. In some embodiments, the lateral surface 203 and the lateral surface 204 of the contact structure 20 are concave toward inside of the contact structure 20. In some embodiments, the lateral surface 203 and the lateral surface 204 of the contact structure 20 are concave curved surfaces from a top view perspective.

In some embodiments, the contact structure 20 may include a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the contact structure 20 includes doped polysilicon. In some embodiments, the contact structure 20 may serve as a bit line contact.

The conductive element 30 may be disposed or formed on the semiconductor substrate 10. In some embodiments, the conductive element 30 is disposed or formed on the isolation structure 130 of the semiconductor substrate 10. In some embodiments, the conductive element 30 has a curved surface 301. In some embodiments, the conductive element 30 may be formed of or include silicon or metal. The metal may include, for example, aluminum, copper, tungsten, or cobalt. In some embodiments, the conductive element 30 may include a dopant material including silicon (Si), germanium (Ge), phosphine (P), arsenic (As), antimony (Sb), or any combination thereof. In some embodiments, the conductive element 30 may be formed of or include doped polysilicon. In some embodiments, the conductive element 30 may be formed of or include aluminum, copper, tungsten, cobalt, or an alloy thereof. In some embodiments, the conductive element 30 may be formed of or include metal nitride or metal silicide. In some embodiments, the conductive element 30 may serve as a contact plug electrically connected to a capacitor.

The dielectric spacer 45 may be adjacent to the contact structure 20 and has at least one concave surface (e.g., concave surfaces 401, 401A, 401B, and 401C). In some embodiments, the conductive element 30 is partially surrounded by the concave surface 401 of the dielectric spacer 45. In some embodiments, a curvature of the curve surface 301 of the conductive element 30 is greater than a curvature of the concave surface 401 of the dielectric spacer 45.

In some embodiments, the dielectric spacer 45 has a network structure. In some embodiments, the dielectric spacer 45 includes a plurality of the dielectric spacer structures (e.g., dielectric spacer structures 40, 40A, 40B, 40C, 40D, and 40E) and a plurality of dielectric structures (e.g., dielectric structures 50A, 50B, 50C, and 50D). The dielectric structures 50A, 50B, 50C, and 50D may be formed of or include a dielectric material such as silicon oxide, silicon nitride, silicon oxynitride, or a combination thereof. In some embodiments, the dielectric structures 50A, 50B, 50C, and 50D include silicon nitride.

In some embodiments, the dielectric structures 40, 40A, 40B, 40C, 40D, and 40E are connected to the dielectric spacer structures 50A, 50B, 50C, and 50D. In some embodiments, the dielectric spacer structures 40 and 40A are connected to each other through the dielectric structure 50A. In some embodiments, the dielectric spacer structures 40 and 40B are connected to each other through the dielectric structure 50B. In some embodiments, the dielectric spacer structures 40C and 40D are connected to each other through the dielectric structure 50C. In some embodiments, the dielectric spacer structures 40C and 40E are connected to each other through the dielectric structure 50D.

In some embodiments, the dielectric spacer structure 40 is at the side 201 of the contact structure 20 and has the concave surface 401. In some embodiments, the dielectric spacer structure 40 is between the contact structure 20 and the conductive element 30. In some embodiments, the concave surface 401 of the dielectric spacer structure 40 is facing the conductive element 30. In some embodiments, the concave surface 401 of the dielectric spacer structure 40 surrounds a portion of the conductive element 30. In some embodiments, the dielectric spacer structure 40 further has a surface 402 opposite to the concave surface 401. In some embodiments, the surface 402 of the dielectric spacer structure 40 directly contacts the contact structure 20. In some embodiments, the surface 402 of the dielectric spacer structure 40 is a substantially flat surface.

In some embodiments, the dielectric spacer structure 40 has a U-shape structure from a top view perspective. In some embodiments, the dielectric spacer structure 40 includes dielectric layers 410, 420, and 430.

In some embodiments, the dielectric layer 410 is at the side 201 of the contact structure 20. In some embodiments, the dielectric layer 410 has a U-shape structure from a top view perspective. In some embodiments, the dielectric layer 410 includes a portion 410A at the side 201 of the contact structure 20 and a portion 410B adjacent to the conductive element 30. In some embodiments, the portion 410A of the dielectric layer 410 contacts the side 201 of the contact structure 20. In some embodiments, the portion 410A of the dielectric layer 410 has a U-shape structure from a top view perspective. In some embodiments, the portion 410A of the dielectric layer 410 has a concave surface facing the conductive element 30. In some embodiments, the portion 410B of the dielectric layer 410 contacts the isolation structure 130 of the semiconductor substrate 10. In some embodiments, the portion 410B of the dielectric layer 410 contacts the conductive element 30. In some embodiments, the portion 410B of the dielectric layer 410 has a U-shape structure from a top view perspective. In some embodiments, the portion 410B of the dielectric layer 410 has a concave surface (e.g., the concave surface 401) facing the conductive element 30. The dielectric layer 410 may be formed of or include a dielectric material such as silicon oxide, silicon nitride, silicon oxynitride, or a combination thereof. In some embodiments, the dielectric layer 410 includes silicon nitride.

In some embodiments, the dielectric layer 420 is adjacent to the dielectric layer 410. In some embodiments, the dielectric layer 420 has a U-shape structure from a top view perspective. In some embodiments, the dielectric layer 420 includes a portion 420A adjacent to the side 201 of the contact structure 20 and a portion 420B adjacent to the conductive element 30. In some embodiments, the portion 420A of the dielectric layer 410 contacts the portion 410A of the dielectric layer 410. In some embodiments, the portion 420A of the dielectric layer 420 has a U-shape structure from a top view perspective. In some embodiments, the portion 420A of the dielectric layer 420 has a concave surface facing the conductive element 30. In some embodiments, the portion 420B of the dielectric layer 420 contacts the portion 410B of the dielectric layer 410. In some embodiments, the portion 420B of the dielectric layer 420 has a U-shape structure from a top view perspective. In some embodiments, the portion 420B of the dielectric layer 420 has a concave surface facing the conductive element 30. The dielectric layer 420 may be formed of or include a dielectric material such as silicon oxide, silicon nitride, silicon oxynitride, or a combination thereof. In some embodiments, the dielectric layer 420 includes silicon oxide.

In some embodiments, the dielectric layer 430 is adjacent to the dielectric layer 420. In some embodiments, the dielectric layer 430 is between the portion 420A and the portion 420B of the dielectric layer 420. In some embodiments, the dielectric layer 430 has a U-shape structure from a top view perspective. In some embodiments, the dielectric layer 430 has a concave surface facing the conductive element 30. The dielectric layer 430 may be formed of or include a dielectric material such as silicon oxide, silicon nitride, silicon oxynitride, or a combination thereof. In some embodiments, the dielectric layer 430 includes silicon nitride.

In some embodiments, the conductive element 30A is adjacent to the conductive element 30. In some embodiments, the conductive element 30A is disposed or formed on the isolation structure 130 of the semiconductor substrate 10.

In some embodiments, the dielectric spacer structure 40A is adjacent to the conductive element 30A. In some embodiments, the dielectric spacer structure 40A is between the contact structure 20A and the conductive element 30A. In some embodiments, the dielectric spacer structure 40A has a concave surface 401A facing the conductive element 30A. In some embodiments, the concave surface 401A of the dielectric spacer structure 40A surrounds a portion of the conductive element 30A. In some embodiments, the dielectric spacer structure 40A further has a substantially flat surface that is opposite to the concave surface 401A and directly contacting the contact structure 20A. In some embodiments, the dielectric spacer structure 40A has a U-shape structure from a top view perspective.

In some embodiments, the concave surface 401 of the dielectric spacer structure 40 and the concave surface 401A of the dielectric spacer structure 40A are facing toward opposite directions.

In some embodiments, the dielectric structure 50A is disposed or formed between the dielectric spacer structure 40 and the dielectric spacer structure 40A. In some embodiments, the dielectric structure 50A directly contacts the dielectric spacer structure 40 and the dielectric spacer structure 40A.

In some embodiments, the conductive element 30C is adjacent to the conductive element 30. In some embodiments, the conductive element 30C is disposed or formed on the isolation structure 130 of the semiconductor substrate 10.

In some embodiments, the dielectric spacer structure 40C is at the side 202 of the contact structure 20 and has a concave surface 401C. In some embodiments, the dielectric spacer structure 40C is between the contact structure 20 and the conductive element 30C. In some embodiments, the concave surface 401C of the dielectric spacer structure 40C is facing the conductive element 30C. In some embodiments, the concave surface 401C of the dielectric spacer structure 40C surrounds a portion of the conductive element 30C. In some embodiments, the dielectric spacer structure 40C further has a surface 402C opposite to the concave surface 401C. In some embodiments, the surface 402C of the dielectric spacer structure 40C directly contacts the contact structure 20. In some embodiments, the surface 402C of the dielectric spacer structure 40C is a substantially flat surface. In some embodiments, the dielectric spacer structure 40C has a U-shape structure from a top view perspective.

In some embodiments, the dielectric spacer structure 40 and the dielectric spacer structure 40C are disposed on opposite sides 201 and 202 of the contact structure 20. In some embodiments, the concave surface 401 of the dielectric spacer structure 40 and the concave surface 401C of the dielectric spacer structure 40C are facing toward opposite directions.

In some embodiments, the conductive element 30B is adjacent to the conductive element 30. In some embodiments, the conductive element 30B is disposed or formed on the isolation structure 130 of the semiconductor substrate 10.

In some embodiments, the dielectric spacer structure 40B is adjacent to the conductive element 30B. In some embodiments, the dielectric spacer structure 40B is between the contact structure 20B and the conductive element 30B. In some embodiments, the dielectric spacer structure 40B has a concave surface 401B facing the conductive element 30B. In some embodiments, the concave surface 401B of the dielectric spacer structure 40B surrounds a portion of the conductive element 30B. In some embodiments, the dielectric spacer structure 40B further has a substantially flat surface that is opposite to the concave surface 401B and directly contacting the contact structure 20B. In some embodiments, the dielectric spacer structure 40B has a U-shape structure from a top view perspective.

In some embodiments, the concave surface 401 of the dielectric spacer structure 40 and the concave surface 401B of the dielectric spacer structure 40B are facing toward opposite directions.

In some embodiments, the dielectric structure 50B is disposed or formed between the dielectric spacer structure 40 and the dielectric spacer structure 40B. In some embodiments, the dielectric structure 50B directly contacts the dielectric spacer structure 40 and the dielectric spacer structure 40B.

In some embodiments, the conductive element 30D is adjacent to the conductive element 30C. In some embodiments, the conductive element 30D is disposed or formed on the isolation structure 130 of the semiconductor substrate 10.

In some embodiments, the dielectric spacer structure 40D is adjacent to the conductive element 30D. In some embodiments, the dielectric spacer structure 40D is between the contact structure 20C and the conductive element 30D. In some embodiments, the dielectric spacer structure 40D has a concave surface facing the conductive element 30D. In some embodiments, the concave surface of the dielectric spacer structure 40D surrounds a portion of the conductive element 30D. In some embodiments, the dielectric spacer structure 40D further has a substantially flat surface that is opposite to the concave surface and directly contacting the contact structure 20C. In some embodiments, the dielectric spacer structure 40D has a U-shape structure from a top view perspective.

In some embodiments, the concave surface 401C of the dielectric spacer structure 40C and the concave surface of the dielectric spacer structure 40D are facing toward opposite directions.

In some embodiments, the dielectric structure 50C is disposed or formed between the dielectric spacer structure 40C and the dielectric spacer structure 40D. In some embodiments, the dielectric structure 50C directly contacts the dielectric spacer structure 40C and the dielectric spacer structure 40D.

In some embodiments, the conductive element 30E is adjacent to the conductive element 30C. In some embodiments, the conductive element 30E is disposed or formed on the isolation structure 130 of the semiconductor substrate 10.

In some embodiments, the dielectric spacer structure 40E is adjacent to the conductive element 30E. In some embodiments, the dielectric spacer structure 40E is between the contact structure 20D and the conductive element 30E. In some embodiments, the dielectric spacer structure 40E has a concave surface facing the conductive element 30E. In some embodiments, the concave surface of the dielectric spacer structure 40E surrounds a portion of the conductive element 30E. In some embodiments, the dielectric spacer structure 40E further has a substantially flat surface that is opposite to the concave surface and directly contacting the contact structure 20D. In some embodiments, the dielectric spacer structure 40E has a U-shape structure from a top view perspective.

In some embodiments, the concave surface 401C of the dielectric spacer structure 40C and the concave surface of the dielectric spacer structure 40D are facing toward opposite directions.

In some embodiments, the dielectric structure 50D is disposed or formed between the dielectric spacer structure 40C and the dielectric spacer structure 40D. In some embodiments, the dielectric structure 50D directly contacts the dielectric spacer structure 40C and the dielectric spacer structure 40D.

The buffer layer 60 may be a patterned layer defined by the contact structures 20, 20A, 20B, 20C, and 20D and the dielectric spacer 45. In some embodiments, the buffer layer 60 directly contacts the dielectric spacer 45. The buffer layer 60 may be formed as a stacked layer or a single layer including silicon oxide, silicon nitride, silicon oxynitride, silicon nitride oxide, fluoride-doped silicate, or the like. In some embodiments, the buffer layer 60 includes silicon nitride.

According to some embodiments of the present disclosure, with the design of the network structure of the dielectric spacer 45, the contact structure 20 and the conductive element 30 can be spaced apart from each other by a relatively large distance generated by the dielectric spacer 45, and thus undesired short-circuit between the contact structure 20 (e.g., the bit line contact) and the conductive element 30 (e.g., the contact to a capacitor) can be prevented effectively.

In addition, according to some embodiments of the present disclosure, the dielectric spacer 45 having at least one concave curve surface facing the conductive element 30, the conductive element 30 can be partially surrounded by the dielectric spacer 45. Therefore, the electrical isolation between the contact structure 20 and the conductive element 30 can be achieved with a relatively large shift tolerance for the contact structure 20 and the conductive element 30 during manufacturing. As such, the reliability of the semiconductor structure 1 is increased, and the processing stability and processing window are both increased.

Moreover, according to some embodiments of the present disclosure, with the design that the specific network structure of the dielectric spacer 45 defines the shape of the contact structure 20, the contact area of the contact structure 20 can be increased. Therefore, the resistance can be reduced, and thus the electrical performance can be increased.

Figure 2A:
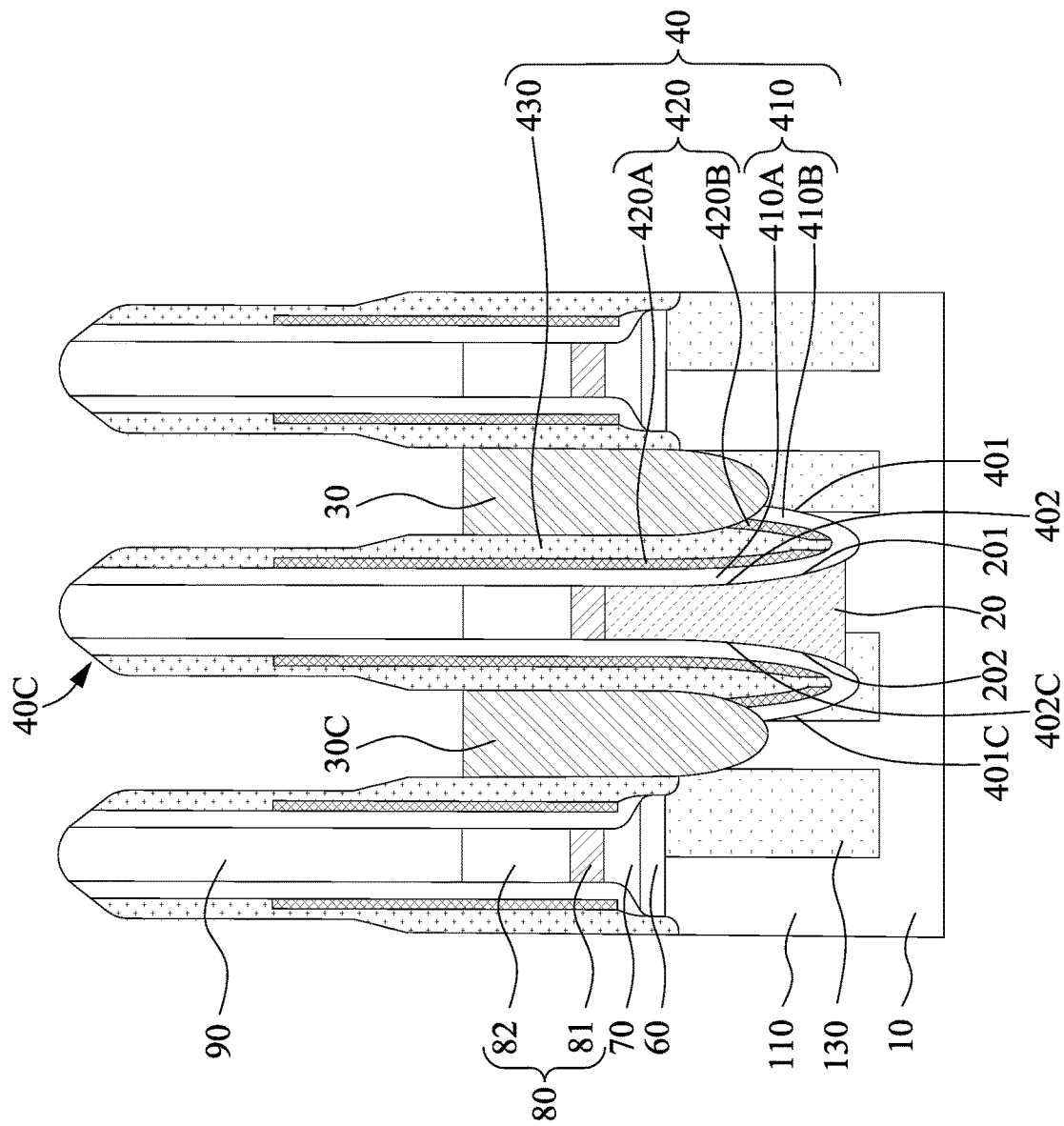
FIG. 2A is a cross-sectional view of a semiconductor structure, in accordance with some embodiments of the present disclosure.

FIG. 2A is a cross-sectional view of a semiconductor structure 1, in accordance with some embodiments of the present disclosure. In some embodiments, FIG. 2A illustrates a cross-sectional view along the cross-sectional line 2-2' in FIG. 1.

In some embodiments, the semiconductor structure 1 includes a semiconductor substrate 10, one or more contact structures (e.g., the contact structure 20), one or more conductive elements (e.g., the conductive elements 30 and 30C), a dielectric spacer 45, a buffer layer 60, a passivation layer 70, a conductive structure 80, and a hardmask structure 90.

The semiconductor substrate 10 may include one or more active regions 110 and one or more isolation structures 130 adjacent to the active regions 110. In some embodiments, the active regions 110 of the semiconductor substrate 10 may be defined by the isolation structures 130. The semiconductor substrate 10 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. The isolation structure 130 may be formed of or include an insulating material such as silicon oxide, silicon nitride, silicon oxynitride, or a combination thereof.

In some embodiments, the contact structure 20 is disposed or formed on the active region 110 of the semiconductor substrate 10. In some embodiments, a portion of the contact structure 20 is disposed or formed on the isolation structure 130 of the semiconductor substrate 10.

In some embodiments, the contact structure 20 may include a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the contact structure 20 includes doped polysilicon. In some embodiments, the contact structure 20 may serve as a bit line contact.

In some embodiments, the conductive element 30 is disposed or formed on the isolation structure 130 of the semiconductor substrate 10. In some embodiments, a portion of the conductive element 30 is disposed over and spaced apart from the active region 110 of the semiconductor substrate 10. In some embodiments, the conductive element 30 is spaced apart from the contact structure 20. In some embodiments, the conductive element 30 is spaced apart from the contact structure 20 by the dielectric spacer structure 40 and the isolation structure 130 of the semiconductor substrate 10.

In some embodiments, the conductive element 30C is disposed or formed on the isolation structure 130 of the semiconductor substrate 10. In some embodiments, the conductive element 30C is spaced apart from the isolation structure 130 of the semiconductor substrate 10 by the dielectric spacer 45. In some embodiments, the conductive element 30C is disposed or formed on a portion the active region 110 of the semiconductor substrate 10. In some embodiments, the conductive element 30C is spaced apart from the contact structure 20. In some embodiments, the conductive element 30C is spaced apart from the contact structure 20 by the dielectric spacer structure 40 and the isolation structure 130 of the semiconductor substrate 10.

In some embodiments, the conductive elements 30 and 30C may be formed of or include silicon or metal. The metal may include, for example, aluminum, copper, tungsten, or cobalt. In some embodiments, the conductive elements 30 and 30C may include a dopant material including silicon (Si), germanium (Ge), phosphine (P), arsenic (As), antimony (Sb), or any combination thereof. In some embodiments, the conductive elements 30 and 30C may be formed of or include doped polysilicon. In some embodiments, the conductive elements 30 and 30C may be formed of or include aluminum, copper, tungsten, cobalt, or an alloy thereof. In some embodiments, the conductive elements 30 and 30C may be formed of or include metal nitride or metal silicide. In some embodiments, each of the conductive elements 30 and 30C may serve as a contact plug electrically connected to a capacitor.

The dielectric spacer 45 may be adjacent to the contact structure 20. In some embodiments, the dielectric layer 420 of the dielectric spacer 45 is disposed or formed on the dielectric layer 410 of the dielectric spacer 45. In some embodiments, the dielectric layer 430 of the dielectric spacer 45 is disposed or formed on the dielectric layer 420 of the dielectric spacer 45.

The dielectric layer 420 may be formed of or include a dielectric material such as silicon oxide, silicon nitride, silicon oxynitride, or a combination thereof. In some embodiments, the dielectric layer 420 includes silicon nitride. The dielectric layer 420 may be formed of or include a dielectric material such as silicon oxide, silicon nitride, silicon oxynitride, or a combination thereof. In some embodiments, the dielectric layer 420 includes silicon oxide. The dielectric layer 430 may be formed of or include a dielectric material such as silicon oxide, silicon nitride, silicon oxynitride, or a combination thereof. In some embodiments, the dielectric layer 430 includes silicon nitride.

In some embodiments, the buffer layer 60 directly contacts dielectric spacer 45. In some embodiments, the buffer layer 60 directly contacts the active region 110 and the isolation structure 130 of the semiconductor substrate 10.

In some embodiments, the passivation layer 70 is disposed or formed on the buffer layer 60. In some embodiments, the passivation layer 70 directly contacts the buffer layer 60. The passivation layer 70 may be formed as a stacked layer or a single layer including silicon oxide, silicon nitride, silicon oxynitride, silicon nitride oxide, fluoride-doped silicate, or the like. In some embodiments, the passivation layer 70 includes silicon oxide.

The conductive structure 80 may be disposed over the semiconductor substrate 10. In some embodiments, one or more portions of the conductive structure 80 are disposed on the contact structure 20. In some embodiments, portions of the conductive structure 80 are disposed on the buffer layer 60. In some embodiments, portions of the conductive structure 80 are disposed on the passivation layer 70.

In some embodiments, the conductive structure 80 includes conductive layers 81 and 82. In some embodiments, one or more portions of the conductive layer 81 are disposed on the contact structure 20. In some embodiments, portions of the conductive layer 81 are disposed on the buffer layer 60. In some embodiments, portions of the conductive layer 81 are disposed on the passivation layer 70. In some embodiments, the conductive layer 82 is disposed on the conductive layer 81. The conductive layer 81 may be formed of, for example, polysilicon or titanium nitride. The conductive layer 82 may be formed of, for example, copper, nickel, cobalt, aluminum, or tungsten. In some embodiments, the conductive structure 80 (e.g., the conductive layers 81 and 82) include bit line layers.

The hardmask structure 90 may be disposed on the conductive structure 80. In some embodiments, each portion of the hardmask structure 90 is disposed between adjacent dielectric spacer structures (e.g., the dielectric spacer structures 40 and 40C).

According to some embodiments, with the design of the network structure of the dielectric spacer 45, despite that the contact structure 20 is not formed on the exact predetermined position (e.g., a large portion of the conductive element 30C contacts the active region 110 of the semiconductor structure 1 shown in FIG. 2A, instead of the conductive element 30C mostly contacting the isolation structure 130 of the semiconductor structure), the electrical isolation between the contact structure 20 and the conductive element 30 can be achieved by the dielectric spacer 45.

Figure 2B:
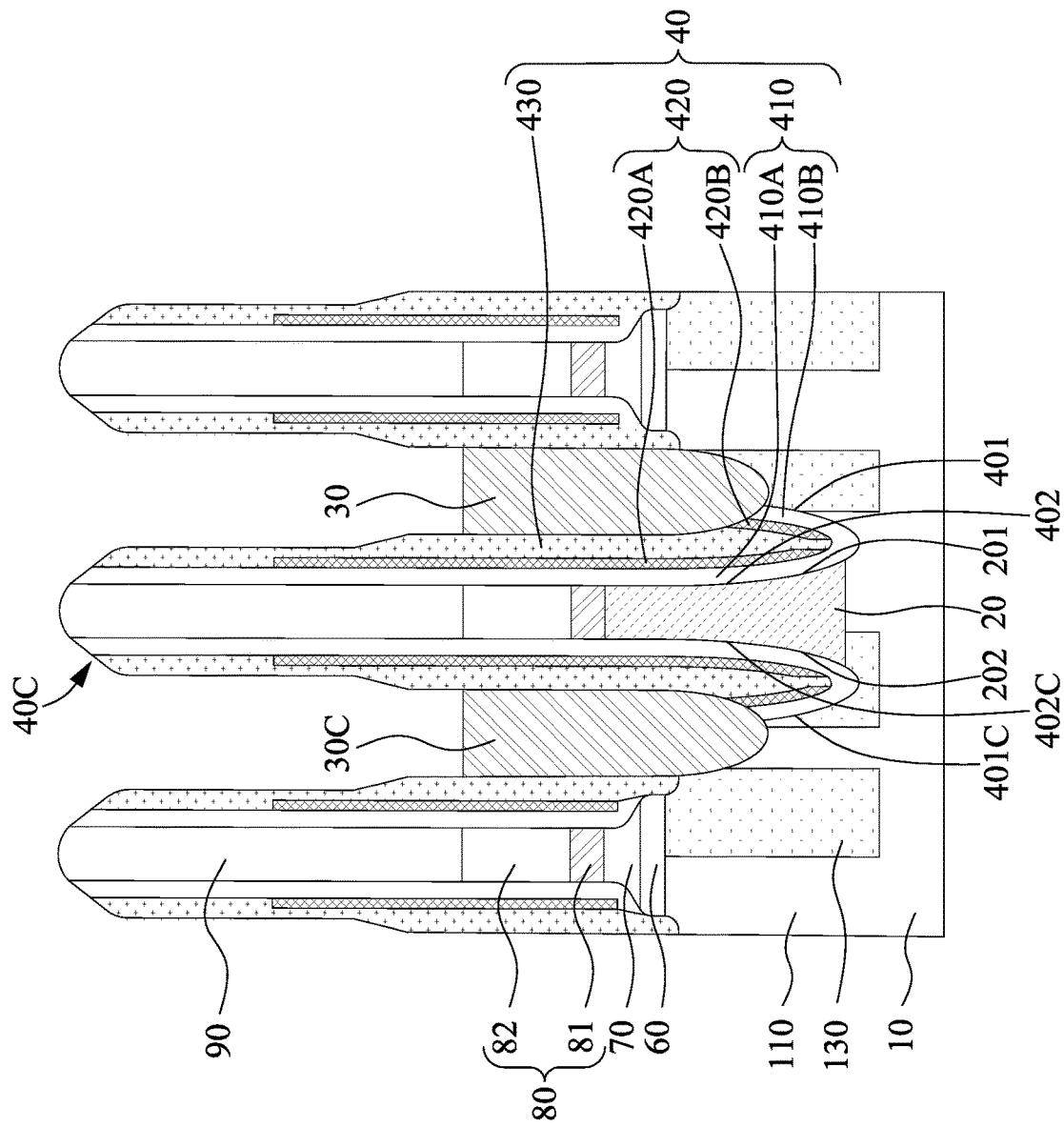
FIG. 2B is a cross-sectional view of a semiconductor structure, in accordance with some embodiments of the present disclosure.

FIG. 2B is a cross-sectional view of a semiconductor structure 1A, in accordance with some embodiments of the present disclosure. In some embodiments, FIG. 2B illustrates a cross-sectional view along the cross-sectional line 2-2' in FIG. 1. The semiconductor structure 1A is similar to the semiconductor structure 1 shown in FIG. 2A, with differences therebetween as follows. Descriptions of similar components are omitted.

In some embodiments, the conductive element 30 is disposed or formed on the isolation structure 130 of the semiconductor substrate 10. In some embodiments, a portion of the conductive element 30 is disposed over and spaced apart from the active region 110 of the semiconductor substrate 10. In some embodiments, the conductive element 30 is spaced apart from the contact structure 20. In some embodiments, the conductive element 30 is spaced apart from the contact structure 20 by the dielectric spacer structure 40 and the isolation structure 130 of the semiconductor substrate 10.

In some embodiments, the conductive element 30C is disposed or formed on the isolation structure 130 of the semiconductor substrate 10. In some embodiments, the conductive element 30C is disposed or formed on a portion the active region 110 of the semiconductor substrate 10. In some embodiments, the conductive element 30C directly contacts a portion the isolation structure 130 of the semiconductor substrate 10. In some embodiments, the conductive element 30C is spaced apart from the contact structure 20. In some embodiments, the conductive element 30C is spaced apart from the contact structure 20 by the dielectric spacer structure 40 and the isolation structure 130 of the semiconductor substrate 10. In some embodiments, each of the conductive elements 30 and 30C may serve as a contact plug electrically connected to a capacitor.

According to some embodiments, with the design of the network structure of the dielectric spacer 45, despite that the contact structure 20 is not formed on the exact predetermined position (e.g., only a small portion of the conductive element 30C contacts the isolation structure 130 of the semiconductor structure 1B shown in FIG. 2B, instead of the conductive element 30C mostly contacting the isolation structure 130 of the semiconductor structure), the electrical isolation between the contact structure 20 and the conductive element 30 can be achieved by the dielectric spacer 45.

FIG. 3A to FIG. 7B illustrate various stages of a method of manufacturing a semiconductor structure 1, in accordance with some embodiments of the present disclosure.

Figure 3A:
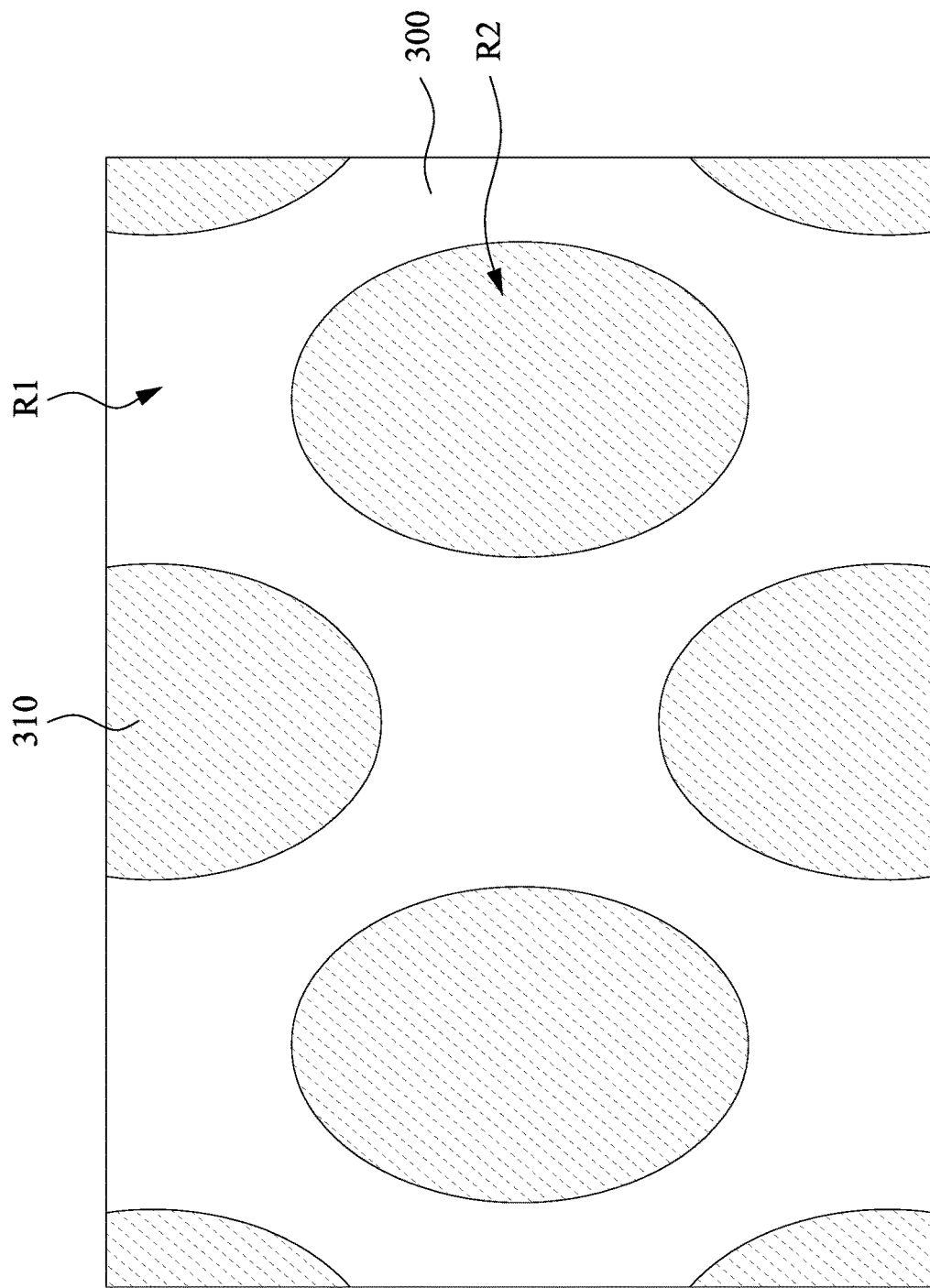
FIG. 3A illustrates one or more stages of a method of manufacturing a semiconductor structure, in accordance with some embodiments of the present disclosure.
Figure 3B:
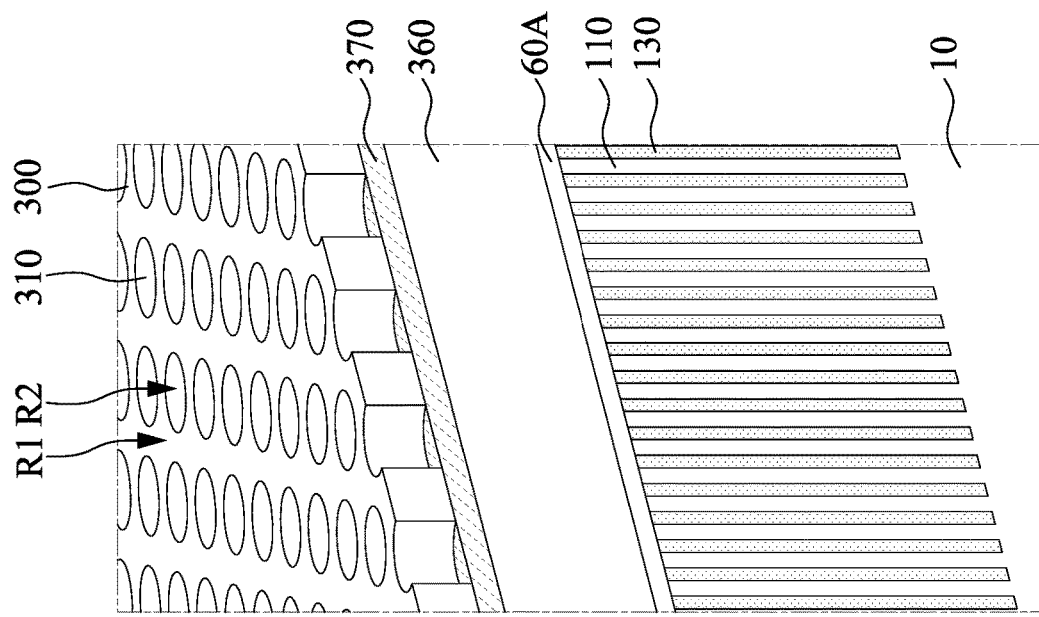
FIG. 3B illustrates one or more stages of a method of manufacturing a semiconductor structure, in accordance with some embodiments of the present disclosure.

FIG. 3A and FIG. 3B illustrate one or more stages of a method of manufacturing a semiconductor structure, in accordance with some embodiments of the present disclosure. In some embodiments, FIG. FIG. 3A is a top view of a portion of the structure illustrated in FIG. 3B.

Referring to FIG. 3A and FIG. 3B, a semiconductor substrate 10 may be provided. The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Still referring to FIG. 3A and FIG. 3B, isolation structures 130 may be formed in the semiconductor substrate 10, and active regions 110 of the semiconductor substrate 10 may be defined by the isolation structures 130. A photolithography process may be performed to pattern the semiconductor substrate 10 to define positions of the plurality of active regions 110. An etch process may be performed after the photolithography process to form a plurality of trenches in the semiconductor substrate 10. After the etch process, an insulating material such as silicon oxide, silicon nitride, silicon oxynitride, silicon nitride oxide, or fluoride-doped silicate, may be used to fill the plurality of trenches by a deposition process. A planarization process, such as chemical mechanical polishing, may be performed after the deposition process to remove excess material and provide a substantially flat surface for subsequent processing steps and conformally form the isolation structures 130 and the active regions 110.

Still referring to FIG. 3A and FIG. 3B, a buffer material 60A may be formed on the semiconductor substrate 10. The buffer material 60A may be formed as a stacked layer or a single layer including silicon oxide, silicon nitride, silicon oxynitride, silicon nitride oxide, fluoride-doped silicate, or the like.

Still referring to FIG. 3A and FIG. 3B, an under layer 360 may be formed on the buffer material 60A. In some embodiments, the under layer 360 includes an organic material. In some embodiments, the under layer 360 includes a polymer material. In some embodiments, the under layer 360 serves as a planarization layer. In some embodiments, the under layer 360 has a thickness of about 200 nm.

Still referring to FIG. 3A and FIG. 3B, an anti-reflection coating 370 may be formed on the under layer 360. In some embodiments, the anti-reflection coating 370 directly contacts the under layer 360. In some embodiments, the anti-reflection coating 370 includes an inorganic material. In some embodiments, the anti-reflection coating 370 includes silicon oxynitride. In some embodiments, the anti-reflection coating 370 may include two sub-coating layers having different atomic ratios of silicon to oxygen (Si/O). In some embodiments, the anti-reflection coating 370 has a thickness of about 30 nm.

Still referring to FIG. 3A and FIG. 3B, a patterned sacrificial layer 300 may be formed on the buffer material 60A. In some embodiments, the patterned sacrificial layer 300 is formed on the anti-reflection coating 370. In some embodiments, the patterned sacrificial layer 300 has openings 310 exposing a region R2 of the semiconductor substrate 10. In some embodiments, a region R1 of the semiconductor substrate 10 is covered by the patterned sacrificial layer 300.

In some embodiments, the patterned sacrificial layer 300 may include an ashable hardmask layer. In some embodiments, the patterned sacrificial layer 300 includes a carbon-based material. In some embodiments, the patterned sacrificial layer 300 includes amorphous carbon. In some embodiments, the patterned sacrificial layer 300 has a thickness of about 60 nm.

Figure 4A:
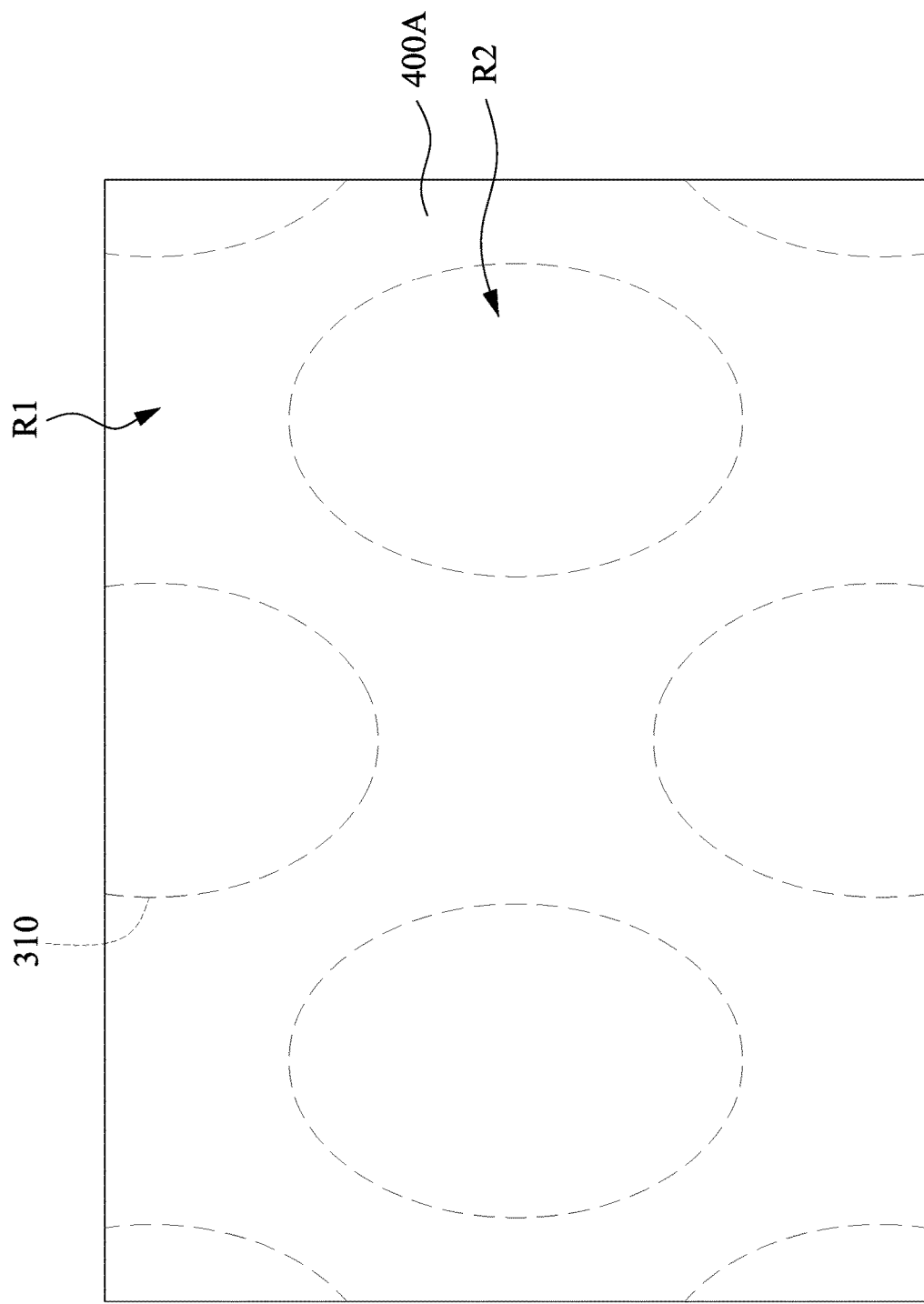
FIG. 4A illustrates one or more stages of a method of manufacturing a semiconductor structure, in accordance with some embodiments of the present disclosure.
Figure 4B:
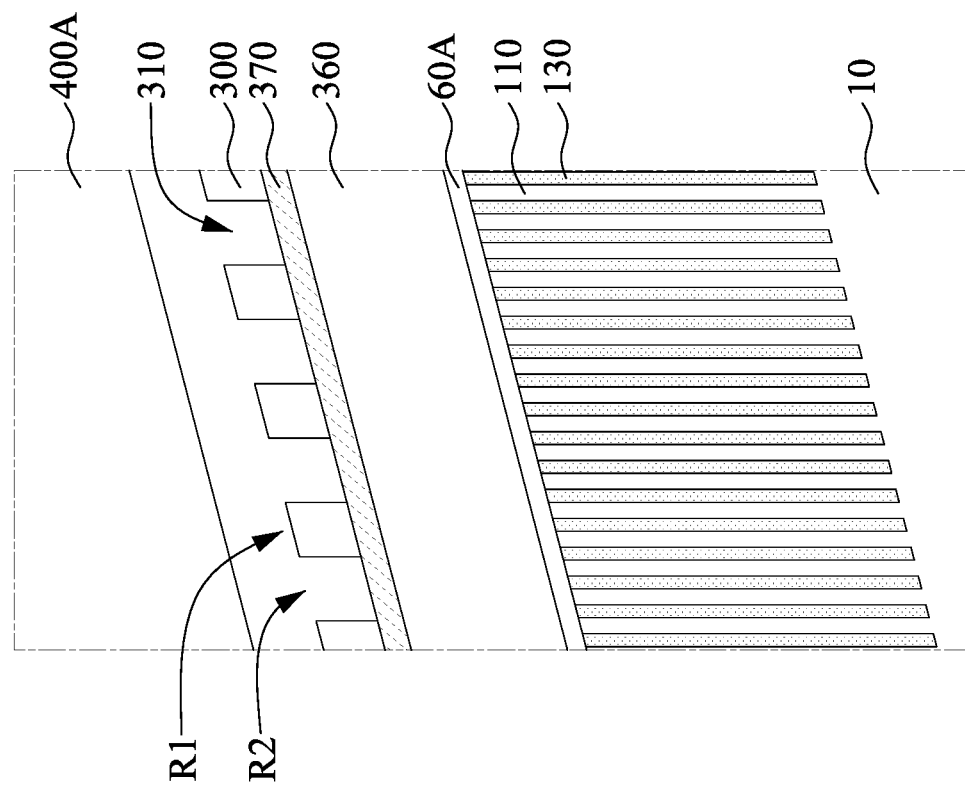
FIG. 4B illustrates one or more stages of a method of manufacturing a semiconductor structure, in accordance with some embodiments of the present disclosure.

FIG. 4A and FIG. 4B illustrates one or more stages of a method of manufacturing a semiconductor structure, in accordance with some embodiments of the present disclosure. In some embodiments, FIG. FIG. 4A is a top view of a portion of the structure illustrated in FIG. 4B.

Referring to FIG. 4A and FIG. 4B, a mask material 400A may be formed on the patterned sacrificial layer 300 and in the openings 310. In some embodiments, the mask material 400A includes oxide, e.g., silicon oxide. In some embodiments, the mask material 400A covers the patterned sacrificial layer 300.

Figure 5A:
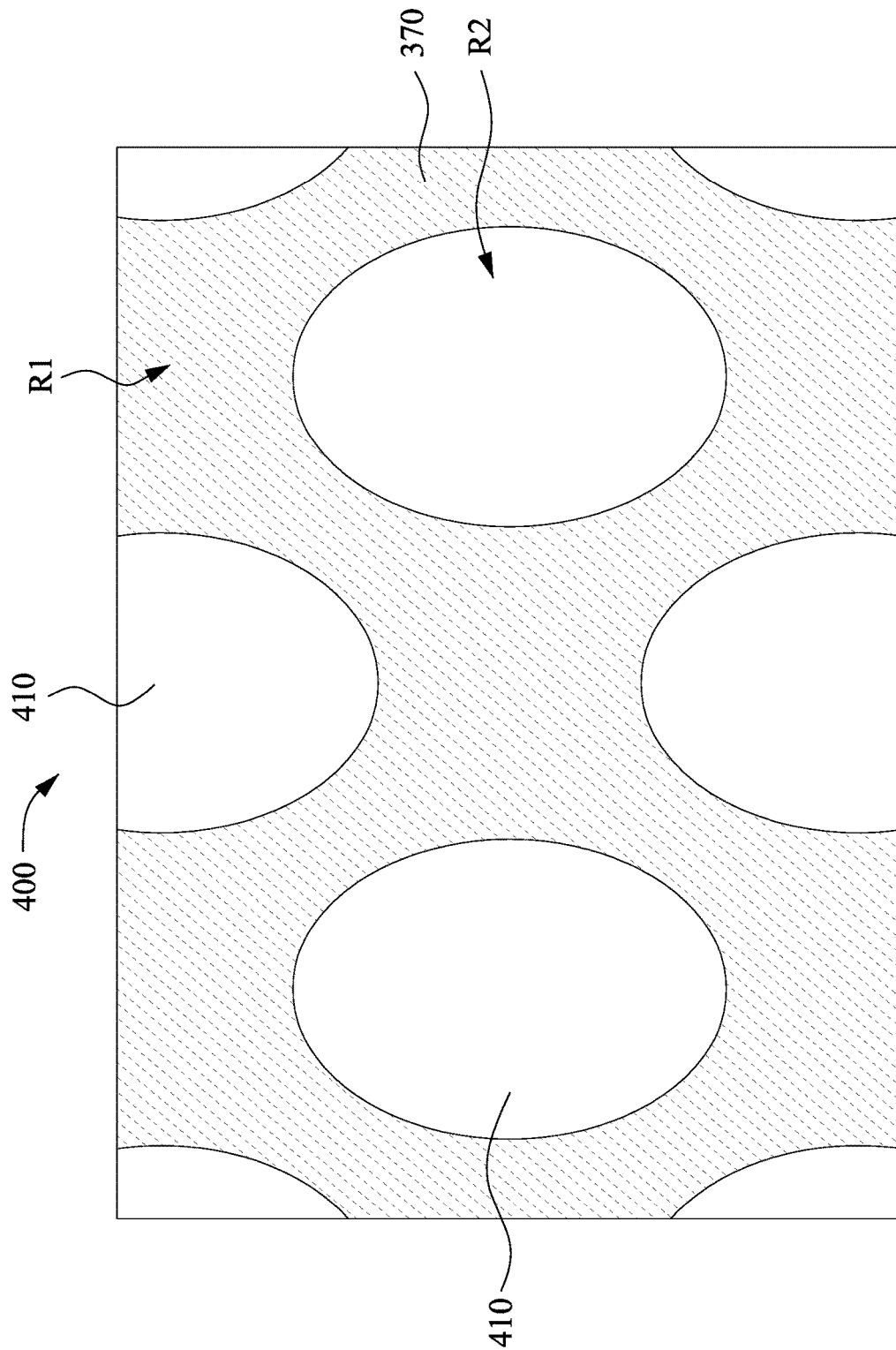
FIG. 5A illustrates one or more stages of a method of manufacturing a semiconductor structure, in accordance with some embodiments of the present disclosure.
Figure 5B:
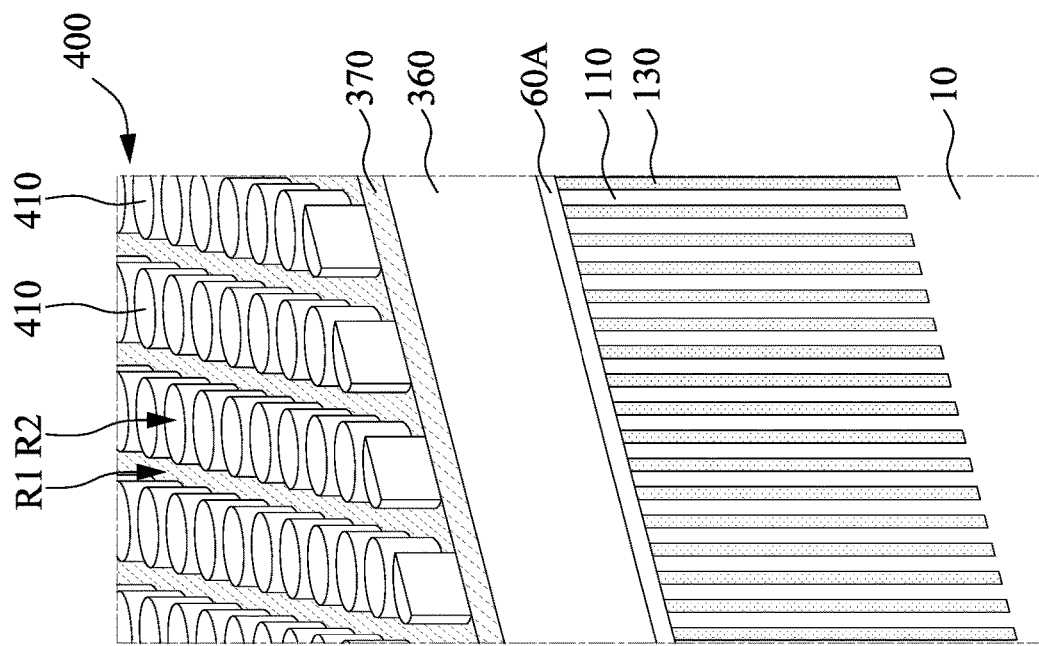
FIG. 5B illustrates one or more stages of a method of manufacturing a semiconductor structure, in accordance with some embodiments of the present disclosure.

FIG. 5A and FIG. 5B illustrates one or more stages of a method of manufacturing a semiconductor structure, in accordance with some embodiments of the present disclosure. In some embodiments, FIG. FIG. 5A is a top view of a portion of the structure illustrated in FIG. 5B.

Referring to FIG. 5A and FIG. 5B, the patterned sacrificial layer 300 may be removed to form a patterned mask layer 400. In some embodiments, a portion of the mask material 400A outside of the openings 310 of the patterned sacrificial layer 300 is removed, e.g., by etching. In some embodiments, after the portion of the mask material 400A outside of the openings of the patterned sacrificial layer 300 is removed, the remained portions of the mask material 400A form the patterned mask layer 400 in the openings 310 of the patterned sacrificial layer 300. In some embodiments, the patterned sacrificial layer 300 is removed by a thermal treatment. In some embodiments, the patterned sacrificial layer 300 is formed of carbon, and oxygen is introduced to react with carbon to form carbon dioxide gas as a by-product under the thermal treatment and to form the patterned sacrificial layer 300 on the buffer material 60A.

In some embodiments, the patterned mask layer 400 exposes the region R1 of the semiconductor substrate 10. In some embodiments, the patterned mask layer 400 includes a plurality of portions 410 covering the region R2 of the semiconductor substrate 10.

Figure 6A:
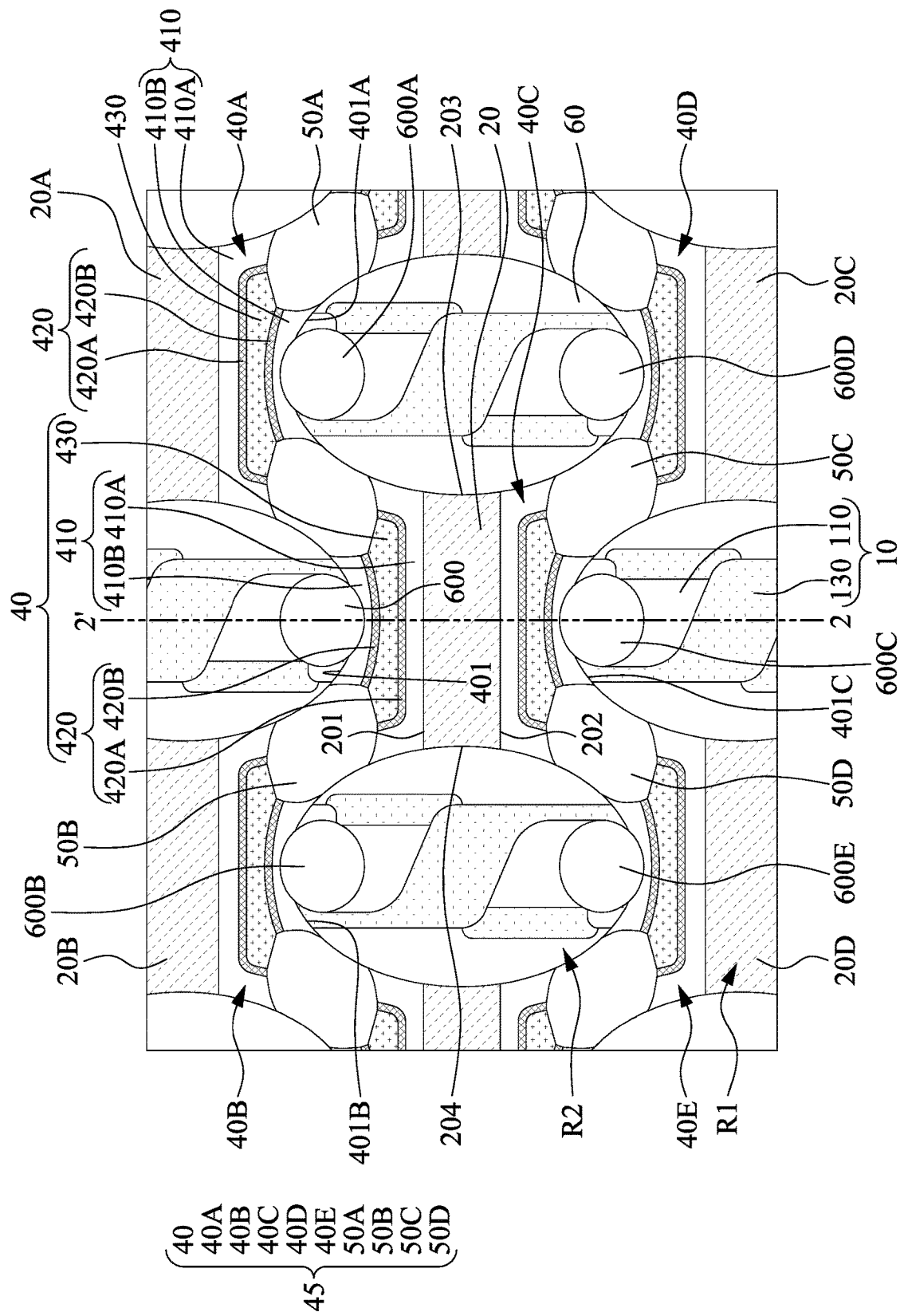
FIG. 6A illustrates one or more stages of a method of manufacturing a semiconductor structure, in accordance with some embodiments of the present disclosure.
Figure 6B:
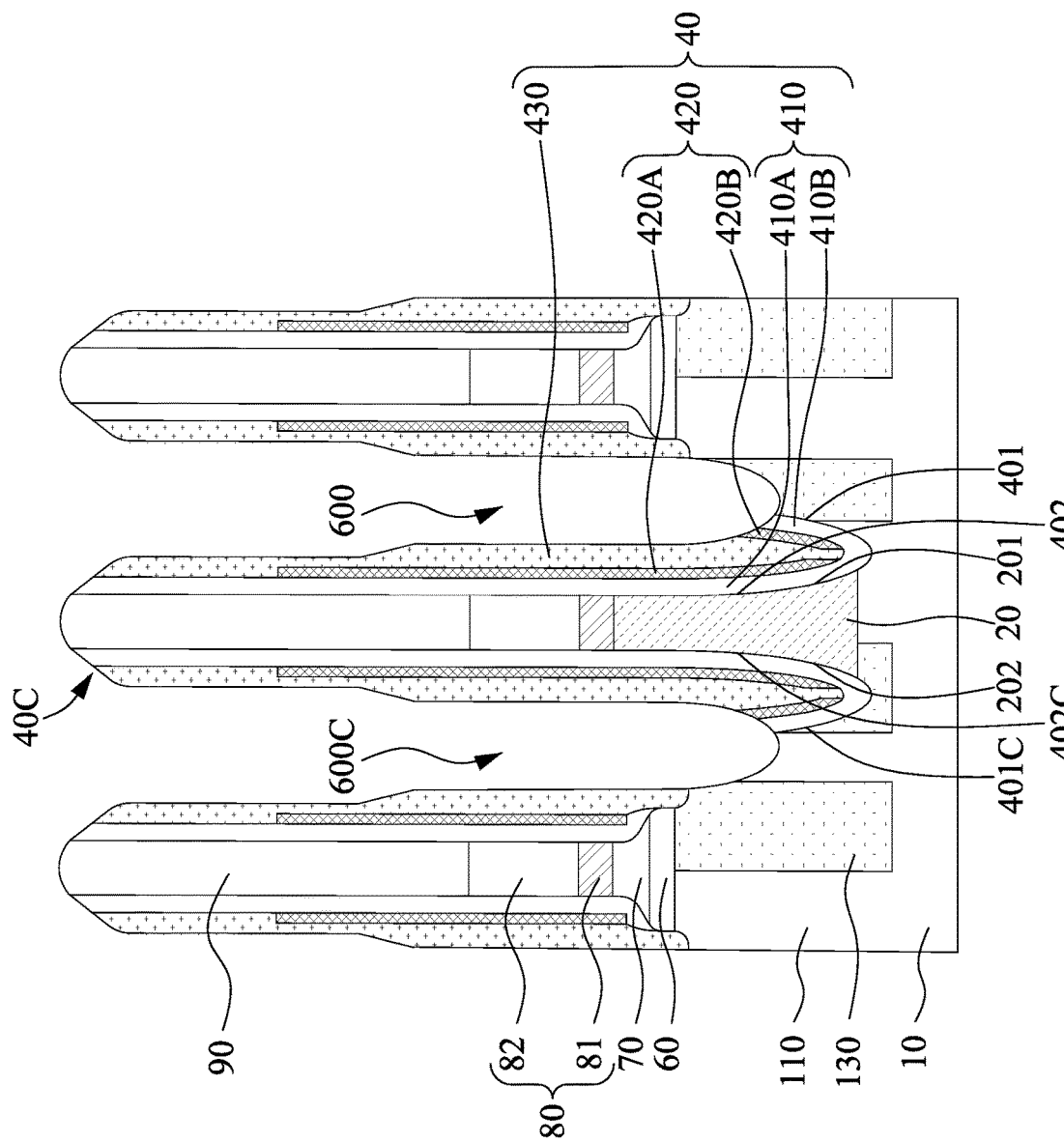
FIG. 6B illustrates one or more stages of a method of manufacturing a semiconductor structure, in accordance with some embodiments of the present disclosure.

FIG. 6A and FIG. 6B illustrates one or more stages of a method of manufacturing a semiconductor structure, in accordance with some embodiments of the present disclosure. In some embodiments, FIG. FIG. 6B is a cross-sectional view along the cross-sectional line 6B-6B' in FIG. 6A.

Referring to FIG. 6A and FIG. 6B, a portion of the buffer material 60A may be removed according to the patterned mask layer 400 to form a buffer layer 60 exposing the region R1 of the semiconductor substrate 10, and the patterned mask layer 400 may be removed.

In some embodiments, one or more contact structures (e.g., contact structures 20, 20A, 20B, 20C, 20D, and 20E) are formed over the region R1 of the semiconductor substrate 10. In some embodiments, the dielectric spacer 45 is formed over the region R1 of the semiconductor substrate 10. In some embodiments, one or more trenches (e.g., trenches 600, 600A, 600B, 600C, 600D, and 600E) are formed over the region R2 of the semiconductor substrate 10.

In some embodiments, one or more contact structures (e.g., contact structures 20, 20A, 20B, 20C, 20D, and 20E) are formed on the active region(s) 110 of the semiconductor substrate 10. In some embodiments, the dielectric spacer 45 (e.g., the dielectric spacer structures 40 and 40C) is formed on opposite sides 201 and 202 of the at least one of the contact structures 20, 20A, 20B, 20C, 20D, and 20E.

Figure 7A:
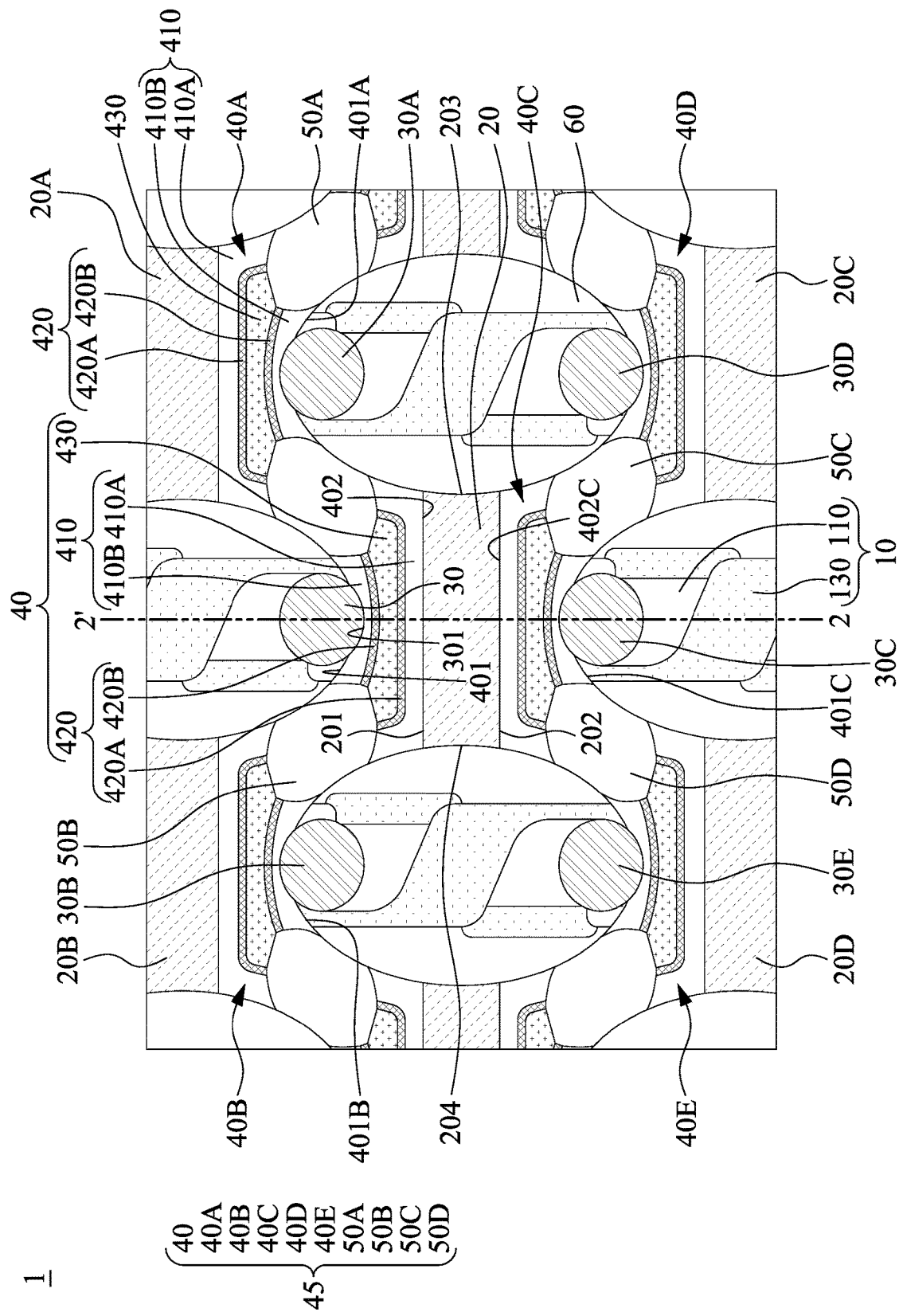
FIG. 7A illustrates one or more stages of a method of manufacturing a semiconductor structure, in accordance with some embodiments of the present disclosure.
Figure 7B:
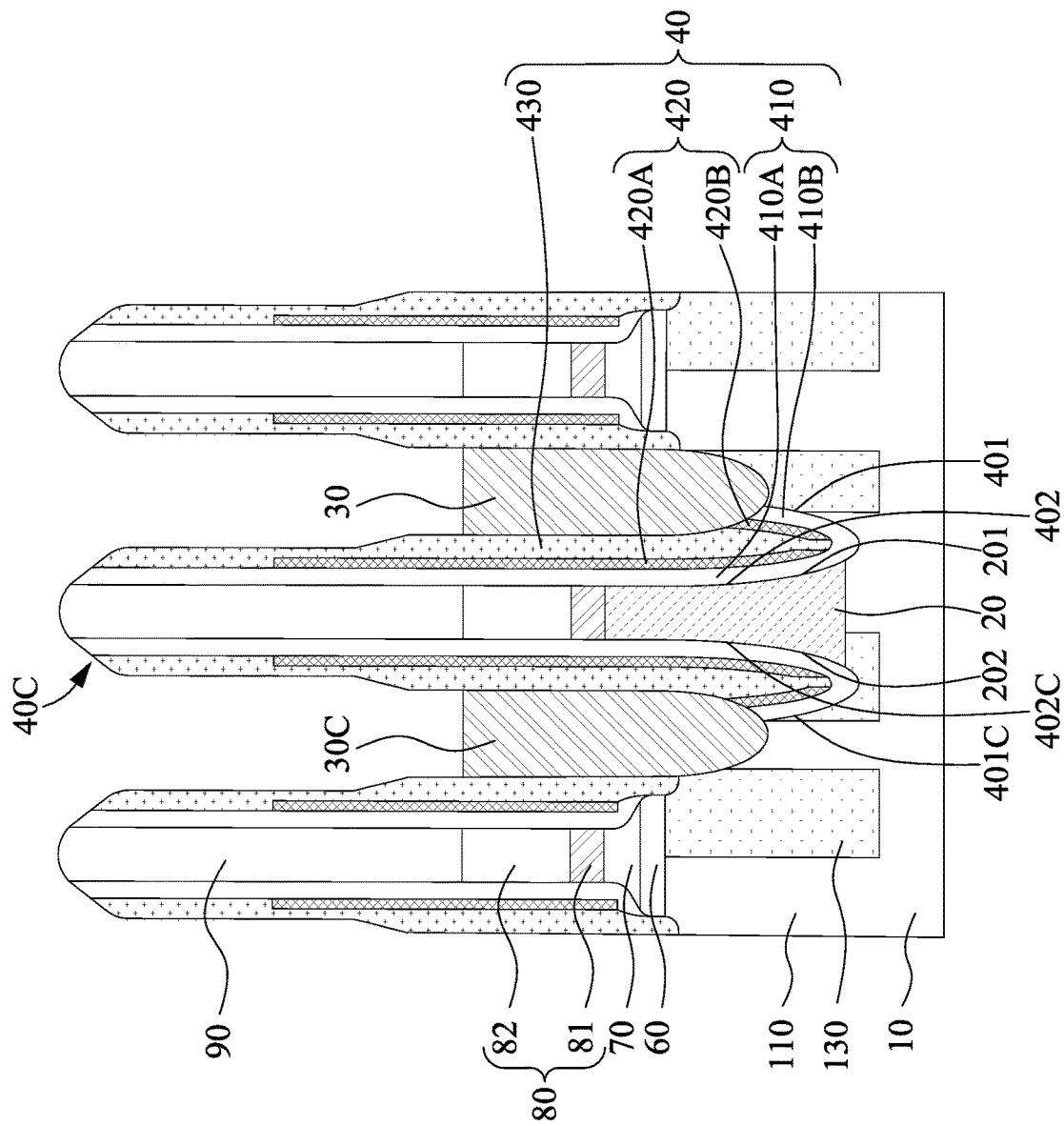
FIG. 7B illustrates one or more stages of a method of manufacturing a semiconductor structure, in accordance with some embodiments of the present disclosure.

FIG. 7A and FIG. 7B illustrates one or more stages of a method of manufacturing a semiconductor structure, in accordance with some embodiments of the present disclosure. In some embodiments, FIG. FIG. 7B is a cross-sectional view along the cross-sectional line 7B-7B' in FIG. 7A.

Referring to FIG. 7A and FIG. 7B, one or more conductive elements (e.g., conductive elements 30, 30A, 30B, 30C, 30D, and 30E) are formed on the isolation structure(s) 130 of the semiconductor substrate 10. In some embodiments, the conductive elements 30, 30A, 30B, 30C, 30D, and 30E formed over the region R2 of the semiconductor substrate 10. In some embodiments, a conductive material may be filled in the trenches 600, 600A, 600B, 600C, 600D, and 600E to form the conductive elements 30, 30A, 30B, 30C, 30D, and 30E. In some embodiments, the conductive material may be polysilicon or doped polysilicon. As such, the semiconductor structure 1 is formed.

Figure 8:
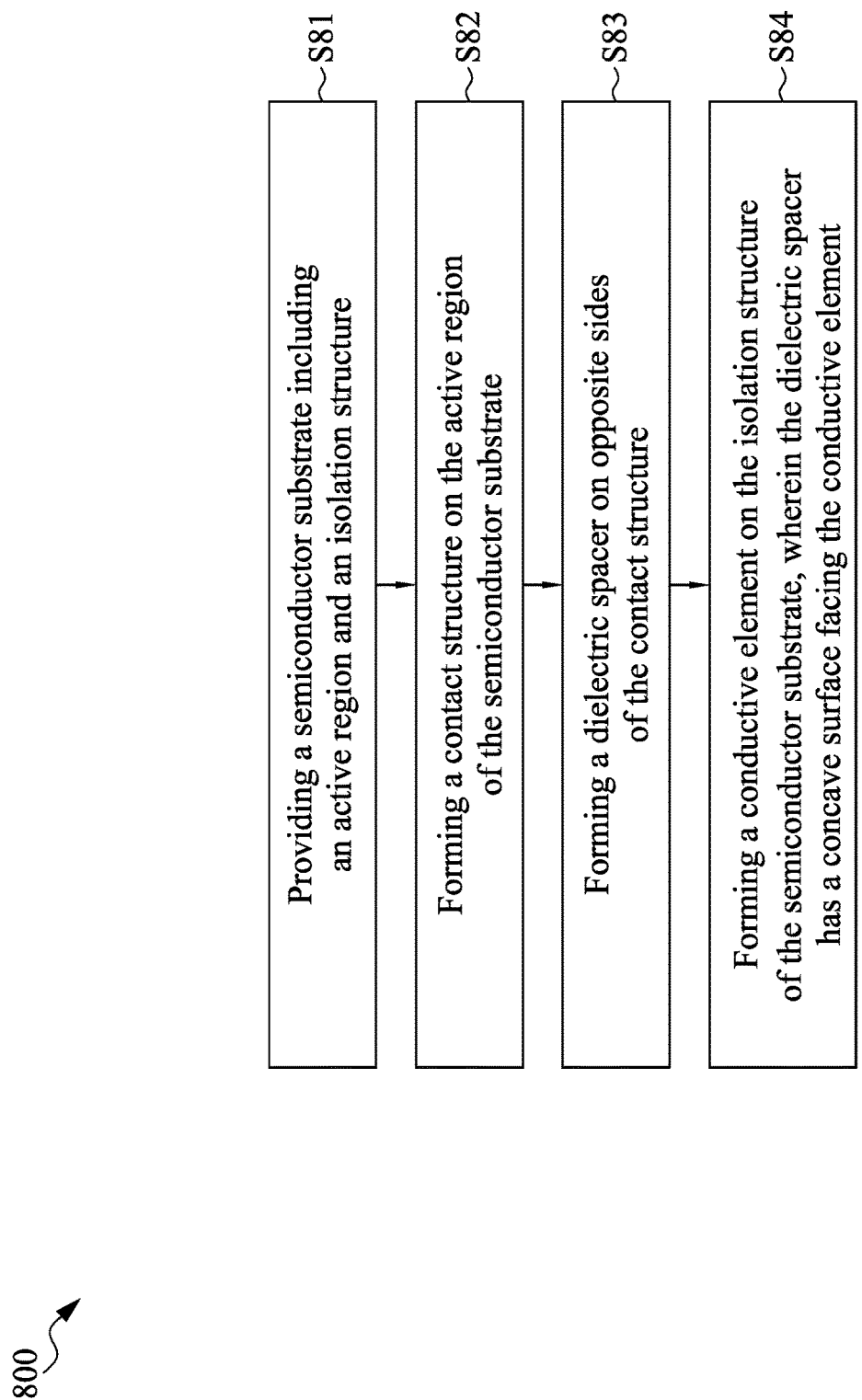
FIG. 8 is a flowchart illustrating a method of manufacturing a semiconductor structure, in accordance with some embodiments of the present disclosure.

FIG. 8 is a flowchart illustrating a method 800 of manufacturing a semiconductor device, in accordance with some embodiments of the present disclosure.

The method 800 begins with operation S81 in which a semiconductor substrate including an active region and an isolation structure is provided.

The method 800 continues with operation S82 in which a contact structure is formed on the active region of the semiconductor substrate.

The method 800 continues with operation S83 in which a dielectric spacer is formed on opposite sides of the contact structure.

The method 800 continues with operation S84 in which a conductive element is formed on the isolation structure of the semiconductor substrate. In some embodiments, the dielectric spacer has a concave surface facing the conductive element.

The method 800 is merely an example, and is not intended to limit the present disclosure beyond what is explicitly recited in the claims. Additional operations can be provided before, during, or after each operations of the method 800, and some operations described can be replaced, eliminated, or moved around for additional embodiments of the method. In some embodiments, the method 800 can include further operations not depicted in FIG. 8. In some embodiments, the method 800 can include one or more operations depicted in FIG. 8.

One aspect of the present disclosure provides a semiconductor structure. The semiconductor structure includes a semiconductor substrate, a contact structure, a first conductive element, and a first dielectric spacer structure. The semiconductor substrate includes an active region and an isolation structure. The contact structure is on the active region of the semiconductor substrate. The first conductive element is on the isolation structure of the semiconductor substrate. The first dielectric spacer structure is between the contact structure and the first conductive element. The first dielectric spacer structure has a first concave surface facing the first conductive element.

Another aspect of the present disclosure provides a semiconductor structure. The semiconductor structure includes a semiconductor substrate, a contact structure, and a dielectric spacer. The contact structure is on the semiconductor substrate. The contact structure has a first side and a second side opposite to the first side. The dielectric spacer is adjacent to the contact structure and has a first concave surface.

Another aspect of the present disclosure provides a method of manufacturing a semiconductor structure. The method includes providing a semiconductor substrate including an active region and an isolation structure. The method also includes forming a contact structure on the active region of the semiconductor substrate. The method further includes forming a dielectric spacer on opposite sides of the contact structure. The method also includes forming a conductive element on the isolation structure of the semiconductor substrate, wherein the dielectric spacer has a concave surface facing the conductive element.

In the semiconductor structure, with the design of the network structure of the dielectric spacer, the contact structure (e.g., the bit line contact) and the conductive element (e.g., the contact to a capacitor) can be spaced apart from each other by a relatively large distance generated by the dielectric spacer, and thus undesired short-circuit between the contact structure (e.g., the bit line contact) and the conductive element (e.g., the contact to a capacitor) can be prevented effectively.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing semiconductor structure, comprising:
    providing a semiconductor substrate;
    forming a contact structure on the semiconductor substrate, the contact structure having a first side and a second side opposite to the first side; and
    forming a dielectric spacer adjacent to the contact structure and having a first concave surface;
    forming a first conductive element on the semiconductor substrate, wherein the first conductive element is partially surrounded by the first concave surface of the dielectric spacer;
    wherein forming the dielectric spacer comprises:
        forming a first dielectric layer at the first side of the contact structure; and
        forming a second dielectric layer on the first dielectric layer, wherein the second dielectric layer has a U-shape structure from a top view perspective.

2. The method of claim 1, wherein forming the dielectric spacer comprises:
    forming a first dielectric spacer structure at the first side of the contact structure and having the first concave surface.

3. The method of claim 2, wherein forming the dielectric spacer further comprises:
    forming a second dielectric spacer structure at the second side of the contact structure and having a second concave surface, wherein the first concave surface and the second concave surface are facing toward opposite directions.

4. The method of claim 1, wherein the contact structure has a first lateral surface extending between the first side and the second side, and the first lateral surface comprises a concave curved surface.

5. The method of claim 4, wherein the contact structure has a second lateral surface opposite to the first lateral surface, and the second lateral surface comprises a concave curved surface.

6. The method of claim 5, wherein the first lateral surface and the second lateral surface are concave toward opposite directions.

7. The method of claim 1, wherein the first conductive element has a curved surface, and a curvature of the curve surface of the first conductive element is greater than a curvature of the concave surface of the dielectric spacer.

8. The method of claim 1, wherein forming the dielectric spacer further comprises:
    forming a third dielectric layer on the second dielectric layer, wherein the third dielectric layer has a U-shape structure from a top view perspective.

9. A method of manufacturing a semiconductor structure, comprising:
    providing a semiconductor substrate comprising an active region and an isolation structure;
    forming a contact structure on the active region of the semiconductor substrate;
    forming a dielectric spacer on opposite sides of the contact structure;
    forming a conductive element on the isolation structure of the semiconductor substrate, wherein the dielectric spacer has a concave surface facing the conductive element;
    forming a buffer material on the semiconductor substrate;
    forming a patterned mask layer on the buffer material, the patterned mask layer exposing a first region of the semiconductor substrate;
    removing a portion of the buffer material according to the patterned mask layer to form a buffer layer exposing the first region of the semiconductor substrate; and
    removing the patterned mask layer.

10. The method of claim 9, wherein the patterned mask layer comprises a plurality of portions covering a second region of the semiconductor substrate.

11. The method of claim 10, wherein the conductive element is formed over the second region of the semiconductor substrate.

12. The method of claim 9, wherein the dielectric spacer is formed over the first region of the semiconductor substrate.

13. The method of claim 9, wherein the contact structure is formed over the first region of the semiconductor substrate.

14. The method of claim 9, wherein forming the patterned mask layer comprises:
- forming a patterned sacrificial layer on the buffer material, the patterned sacrificial layer having openings exposing a second region of the semiconductor substrate;
- forming a mask material on the patterned sacrificial layer and in the openings; and
- removing the patterned sacrificial layer to form the patterned mask layer.

15. The method of claim 14, wherein the patterned sacrificial layer comprises carbon, and the mask material comprises oxide.

\* \* \* \* \*